United States Patent
Huffaker et al.

(10) Patent No.: US 7,288,423 B2
(45) Date of Patent: Oct. 30, 2007

(54) IN-SITU MASK REMOVAL IN SELECTIVE AREA EPITAXY USING METAL ORGANIC CHEMICAL VAPOR DEPOSITION

(75) Inventors: Diana L. Huffaker, Albuquerque, NM (US); Sandy Birodavolu, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 121 days.

(21) Appl. No.: 11/326,433

(22) Filed: Jan. 6, 2006
(Under 37 CFR 1.47)

(65) Prior Publication Data
US 2006/0199385 A1  Sep. 7, 2006

Related U.S. Application Data

(60) Provisional application No. 60/641,735, filed on Jan. 7, 2005.

(51) Int. Cl.
*H01L 21/00* (2006.01)
(52) U.S. Cl. .................. 438/46; 438/483; 257/E21.09; 257/E21.108; 257/E21.109
(58) Field of Classification Search .................. 438/46, 438/483, 492; 257/E21.09, E21.108, E21.109
See application file for complete search history.

(56) References Cited

U.S. PATENT DOCUMENTS 6,111,277 A * 8/2000 Ikeda .......................... 257/99
6,654,396 B1 * 11/2003 Hoshi et al. ............. 372/46.01
7,176,115 B2 * 2/2007 Kitaoka et al. ............. 438/557

OTHER PUBLICATIONS

Birudavolu et al., "In-Situ Mask Removal in Selective Area Epitaxy Using Metal Organic Chemical Vapor Deposition," Journal of Crystal Growth 277 (2005) 97-103.
Berger et al., "Monolithic Integration of GaAs and $In_{0.2}Ga_{0.8}As$ Lasers By Moleculat Beam Epitaxy on GaAs," Appl. Phys. Lett. 58 (23), Jun. 10, 1991, pp. 2698-2700.
Zhang et al., "Selective Area Epitaxy of GaAs Using Tri-Isopropylgallium," Journal of Electronic Materials, vol. 27, No. 5, 1998, p. 446.
Birudavolu et al., "Selective Area Growth of InAs Quantum Dots Formed on a Patterned GaAs Substrate," Applied Physics Letters, vol. 85, No. 12, Sep. 20, 2004, pp. 2337-2339.
Berger et al., "GaAs Quantum Well Laser and Heterojunction Bipolar Transistor Integration Using Molecular Beam Epitaxial Regrowth," Appl. Phys. Lett. 59 (22), Nov. 25, 1991, pp. 2826-2828.

* cited by examiner

*Primary Examiner*—Trung Dang
(74) *Attorney, Agent, or Firm*—MH2 Technology Law Group, LLP.

(57) ABSTRACT

A method for removing a mask in a selective area epitaxy process is provided. The method includes forming a first layer on a substrate and oxidizing the first layer. A patterned photoresist can be formed on the oxidized first layer. A portion of the oxidized first layer can then be removed using a wet chemical etch to form a mask. After removing the patterned photoresist a second layer can be epitaxially grown in a metal organic chemical vapor deposition (MOCVD) chamber or a chemical beam epitaxy (CBE) chamber on a portion of the first layer exposed by the mask. The mask can then be removed the mask in the MOCVD/MBE chamber. The disclosed in-situ mask removal method minimizes both the atmospheric exposure of a growth surface and the number of sample transfers.

20 Claims, 2 Drawing Sheets

IN-SITU MASK REMOVAL IN SELECTIVE AREA EPITAXY USING METAL ORGANIC CHEMICAL VAPOR DEPOSITION

RELATED APPLICATIONS

This application claims priority from U.S. Provisional Patent Application Ser. No. 60/641,735, filed Jan. 7, 2005, which is hereby incorporated by reference in its entirety.

GOVERNMENT INTEREST

This invention was developed under Contract F49620-03-1-0133 between the University of New Mexico and the AFSOR, and Contract MDA972-00-1-0024 between the University of New Mexico and DARPA/Clemson. The U.S. Government may have certain rights to this invention.

FIELD OF THE INVENTION

The present invention relates to selective area epitaxy and, more particularly, to a method for in-situ mask removal for use in selective area epitaxy.

BACKGROUND OF THE INVENTION

Selective area epitaxy (SAE) has been used in the fabrication of advanced devices and circuits including, for example, edge emitting lasers, buried heterostructure lasers, patterned nanostructures, and integrated optoelectronic devices. In an SAE process, a dielectric mask defines window areas on a substrate. Using chemical beam epitaxy (CBE) or metalorganic chemical vapor deposition (MOCVD), eptaxial growth is then confined to those window areas.

Problems arise, however, because common dielectric mask materials such as $SiO_2$ or $SiN_x$ require an ex-situ hydrofluoric acid etch for removal. Moreover, processing schemes typically involve several sample transfer steps to accommodate oxide layer deposition and patterning outside of the growth chamber, a SAE in the growth chamber, followed by mask removal outside of the growth chamber and finally, an overgrowth process. Each exposure of the growth surface to atmosphere can result in contamination that leads to surface degradation, traps, and nonradiative recombination centers.

Thus, there is a need to overcome these and other problems of the prior art to provide a method to remove a mask material using an in-situ etch step that minimizes both the atmospheric exposure of a growth surface and the number of sample transfers.

SUMMARY OF THE INVENTION

In accordance various embodiments, a method for forming a semiconductor device is provided. The method can include forming an $Al_xO_y$ layer on a first layer and patterning the $Al_xO_y$ layer by forming a first region and a second region, wherein a thickness of the second region is greater than a thickness of the first region. The method can further include placing the patterned $Al_xO_y$ layer disposed on the first layer in a growth chamber and then removing the first region of the $Al_xO_y$ layer to expose a first portion of the first-layer. A second layer can be epitaxially grown on the exposed first portion of the first layer and the second region of the $Al_xO_y$ layer can be removed to expose a second portion of the first layer within the growth chamber.

In accordance various other embodiments, another method for removing a mask in a selective area epitaxy process is provided. The method can include forming a first layer on a substrate and then forming an $Al_xO_y$ layer on the first layer. The $Al_xO_y$ layer can be patterned by forming a first region and a second region, wherein a thickness of the second region is greater than a thickness of the first region. The patterned $Al_xO_y$ layer disposed on the first layer can be placed in a growth chamber and a mask can be formed by exposing the patterned $Al_xO_y$ layer to a hydrogen flow at about 900° C., wherein the hydrogen flow removes the first region of the $Al_xO_y$ layer to expose a first portion of the first layer. A second layer can be epitaxially grown on the exposed first portion of the first layer and the mask can be removed to expose a second portion of the first layer by introducing into the growth chamber an etchant comprising HCl in a hydrogen carrier gas.

In accordance various embodiments, a semiconductor device is provided. The semiconductor device can be formed by a method including forming an $Al_xO_y$ layer on a first layer and patterning the $Al_xO_y$ layer by forming a first region and a second region, wherein a thickness of the second region is greater than a thickness of the first region. The patterned $Al_xO_y$ layer disposed on the first layer can be placed in a growth chamber and a dielectric mask can be formed by removing the first region of the $Al_xO_y$ layer to expose a first portion of the first layer. A second layer can be epitaxially grown on the exposed first portion of the first layer. The second region of the $Al_xO_y$ layer can be removed to expose a second portion of the first layer using an in-situ etch.

It is to be understood that both the foregoing general description and the following detailed description are exemplary and explanatory only and are not restrictive of the invention, as claimed.

The accompanying drawings, which are incorporated in and constitute a part of this specification, illustrate an embodiment of the invention and together with the description, serve to explain the principles of the invention.

DESCRIPTION OF THE EMBODIMENTS

Reference will now be made in detail to exemplary embodiments of the invention, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

According to various embodiments of the present teachings depicted in FIGS. 1-6, an SAE process is provided that includes a dielectric mask that can be removed using an in-situ etch. As used herein, the term "in-situ" refers to a process step or process steps within the growth chamber of, for example, a CBE or MOCVD device. In particular, the present teachings disclose exemplary growth and processing sequences that can be used to form and remove an $Al_xO_y$ mask including formation of a very high quality $Al_xO_y$ mask, atomically smooth GaAs/InGaAs SAE, in-situ mask removal and GaAs overgrowth.

Figure 1:
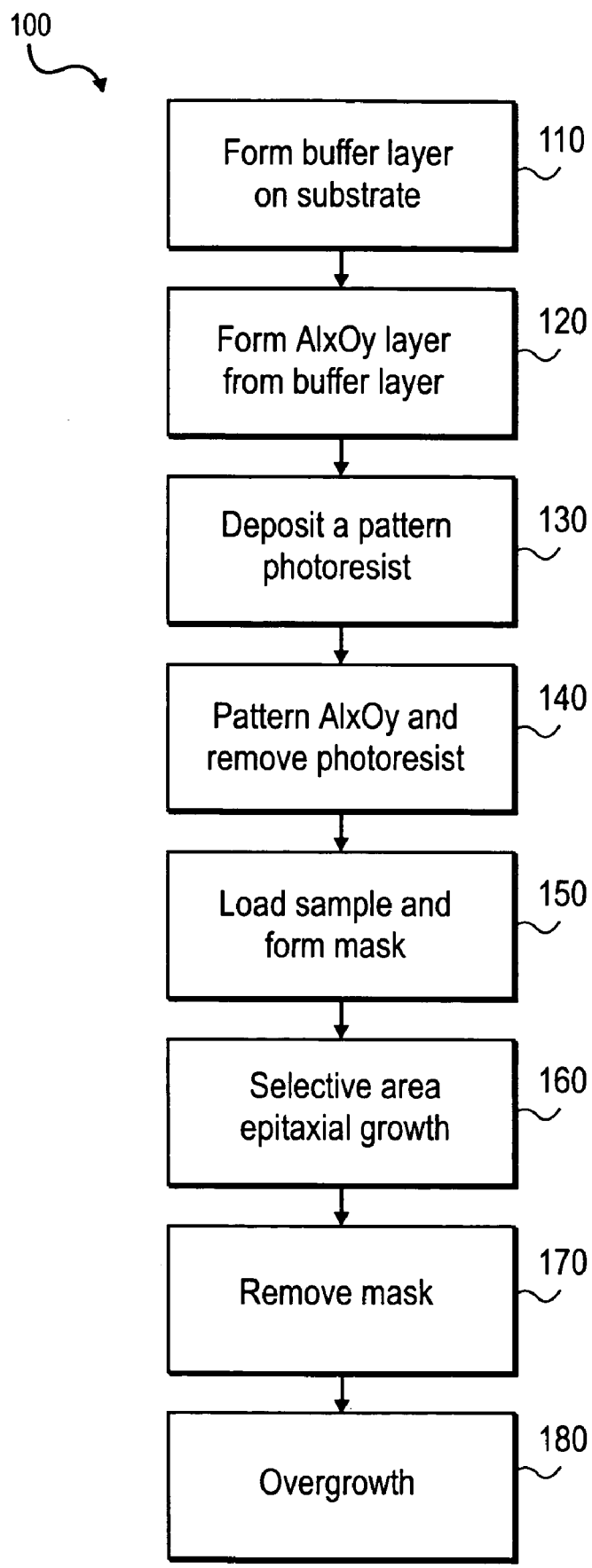
FIG. 1 depicts an exemplary process flow for in-situ mask removal during selective area epitaxial growth in accordance with exemplary embodiments of the present teachings.
Figure 2:
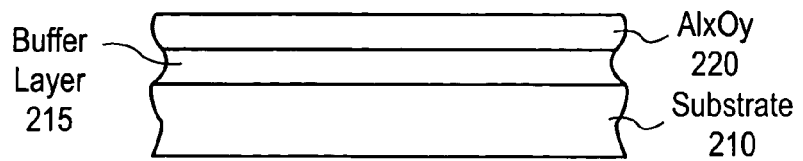
FIG. 2 depicts a step of forming a dielectric mask layer on a first layer in an exemplary process flow in accordance with various embodiments of the present teachings.

Referring to FIG. 1, a method 100 for forming a semiconductor device is provided. At 110, a first layer can be formed on a substrate. As shown in FIG. 2, a substrate 210 can be, for example, a GaAs (100) oriented substrate. Substrate 210 can be deoxidized and a first layer 215 can be formed on substrate 210. In various embodiments first layer 215 can be a buffer layer comprising GaAs.

At 120, a dielectric layer, such as an $Al_xO_y$ layer, can be formed on the first layer. Referring again to FIG. 2, an $Al_xO_y$ layer 220 can be formed on first layer 215. According to various embodiments, $Al_xO_y$ layer 220 can be formed by first forming an AlGaAs layer on first layer 215 and oxidizing the AlGaAs layer. The AlGaAs can be converted to $Al_xO_y$ in a standard oxidation furnace at, for example, 425° C.

Figure 3:
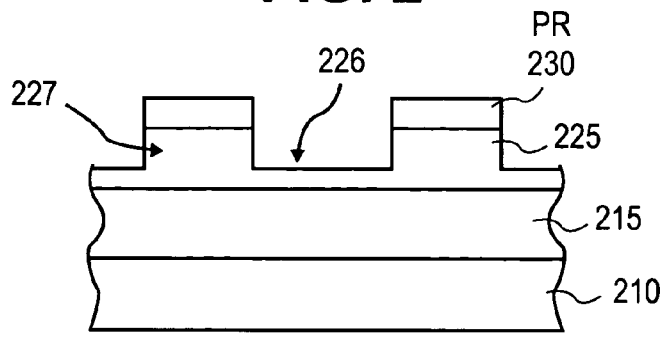
FIG. 3 depicts a step of etching the dielectric mask layer in an exemplary process flow in accordance with various embodiments of the present teachings.

At 130, a photoresist layer can be deposited on the $Al_xO_y$ layer and patterned using photolithographic methods know to one of ordinary skill in the art. As shown in FIG. 3, a patterned photoresist layer 230 can be formed on $Al_xO_y$ layer 220. Then, at 140, the $Al_xO_y$ layer can be patterned, for example, by a wet-chemical etch of undiluted HCl. FIG. 3 shows patterned $Al_xO_y$ layer 225 formed by etching $Al_xO_y$ layer 220. Patterned $Al_xO_y$ layer 225 can include one or more first regions 226 and one or more second region 227. Second regions 227 can be protected from etching by patterned photoresist 230 while first regions 226 can be formed by etching away $Al_xO_y$ such that a thickness of second regions 227 is greater than a thickness of first regions 226. After etching, patterned photoresist 230 can then be removed. Because etching removes only a part of the $Al_xO_y$ in first regions 226, the growth surface can be completely protected from atmospheric exposure, e.g., exposure to $O_2$ or $H_2O$, during subsequent transfer from, for example, a clean room to a MOCVD chamber. Thus, according to various embodiments, steps 110 to 140 can be performed in a clean room.

Figure 4:
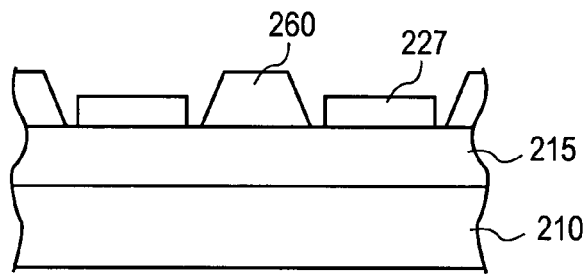
FIG. 4 depicts a step of selective epitaxial growth in an exemplary process flow in accordance with various embodiments of the present teachings.
Figure 5:
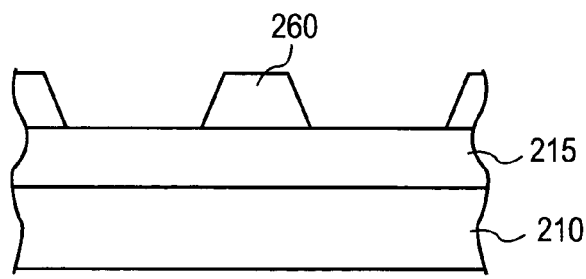
FIG. 5 depicts a step of removing the mask in-situ in an exemplary process flow in accordance with various embodiments of the present teachings.

Patterned $Al_xO_y$ layer 225 disposed on first layer 215 can then be placed into a chamber (also referred to herein as a reactor), such as, for example, a CBE chamber or MOCVD chamber at 150. Referring to FIG. 4, the first regions 227 of $Al_xO_y$ layer 225 can be removed to form a mask that exposes portions of first layer 215. According to various embodiments, first regions 226 can be removed by exposure to a hydrogen flow at a temperature of about 900° C. This exposure can also remove carbon, residual oxygen and other contamination from the exposed surface of first layer 215.

At 160, selective area epitaxy can then be performed. FIG. 4 shows growth of a second layer 260 on the exposed portion of first layer 215. Second layer 260 can be grown by, for example, CBE or MOCVD. In various embodiments, second layer 260 can comprise GaAs. Because a slow growth rate along with a low V/III ratio can prevent is landing on the remaining $Al_xO_y$ mask of region 227, growth rates of second layer 260 can be less than about 7 Å/sec. The V/III ratio refers to the relative flow of the periodic table column V species to the column III species in the reactor. According to various embodiments, a thickness of second layer 260 can be about 600 nm.

After selective area epitaxial growth of second layer 260, second regions 227 forming the mask can be removed in-situ using, for example, HCl in a hydrogen carrier gas at 170. In preparation for mask-removal, the reactor temperature can be reduced and stabilized at about 300° C. under $AsH_3$ overpressure. In various embodiments, an HCl flow rate of about 250 sccm/sec can provide an etch rate of about 1.6 Å/sec at about 300° C. While not intending to be limited to any one theory, it is believed that the mask removal by HCl gas can be explained by the following equation:

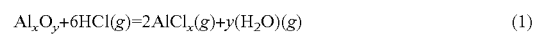

$$Al_xO_y + 6HCl(g) = 2AlCl_x(g) + y(H_2O)(g) \quad (1)$$

Figure 6:
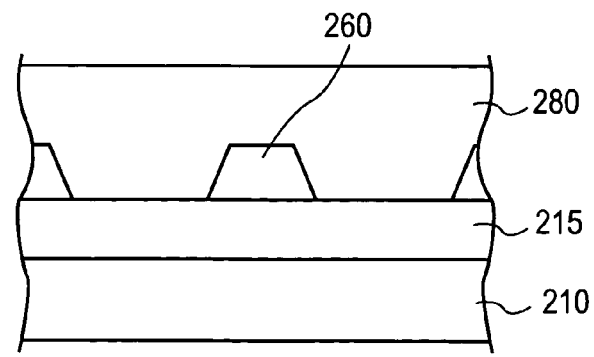
FIG. 6 depicts a step of overgrowth in an exemplary process flow in accordance with various embodiments of the present teachings

At 180, the chamber temperature can be increased to about 600° C. in preparation for an overgrowth process. As shown in FIG. 6, a third layer 280 can be formed. Third layer 280 can comprise, for example, GaAs formed using gas flows similar to the SAE step of 160. In various embodiments, third layer 280 can have a thickness of 100 nm or more.

An exemplary process for in-situ removal of a dielectric mask in an SAE process will now be provided. A GaAs (100) substrate was deoxidized at about 900° C. for 5 minutes under a hydrogen flow during to remove carbon, residual oxygen and other contamination from the substrate surface. A first layer comprising GaAs was then grown on the first layer. A 300 Å thick $Al_{0.95}Ga_{0.05}As$ layer was then formed on the GaAs first layer and a thin GaAs cap layer was formed on the $Al_{0.95}Ga_{0.05}As$ layer. In a clean room, the GaAs cap layer was removed using $NH_4OH:H_2O_2:H_2O$ (1:1:400) to expose the AlGaAs surface for oxidation. An $Al_xO_y$ oxide layer was formed by wet thermal oxidation of the AlGaAs layer. While the oxidation process (120) and mask patterning (140) can be performed in the clean room, the growth surface can be completely protected because the mask can be removed in the MOCVD or CBE chamber during subsequent processing.

The oxide layer was then patterned using a standard photolithographic technique to form 10 μm photoresist stripes on a 20 μm pitch. A wet-chemical etch of undiluted HCl was used to remove the exposed oxide. As shown in FIG. 3, the wet-etch process can partially remove the oxide layer in region 226, thus protecting the growth surface of first layer 215 from atmospheric exposure. The photoresist was then removed and the sample was loaded into the MOCVD system Prior to SAE, the $Al_xO_y$-patterned GaAs sample was treated at 900° C. for 5 minutes under a hydrogen flow to form a mask. The mask was formed by removing regions 226 of the oxide layer and exposing the surface of the GaAs first layer. Growth of the second layer comprising GaAs on the exposed portions of the GaAs first layer was accomplished using a $AsH_3$ flow rate=15 sccm/sec, Trimethylgallium (TMG) flow rate=2.1 sccm/sec., V/III ratio=7.5, and a growth rate=4 Å/sec. The SAE process resulted in a 600 nm GaAs second layer grown on the surface of the GaAs first layer.

Scanning electron microscope examination of the edge of the GaAs stripe/oxide mask interface confirmed a highly selective growth in the open mask regions with no evidence of GaAs islanding or growth on the $Al_xO_y$ surface. The second layer comprising GaAs had an RMS roughness of about 0.0246 nm. The mask surface had an RMS roughness of about 3.157 nm. The oxide surface had a size and density of about 20-50 nm and about $3 \times 10^9$ cm$^2$, respectively.

After the SAE step, the oxide mask was removed in-situ using HCl in a $H_2$ carrier gas. The reactor temperature was reduced and stabilized at 300° C. under $AsH_3$ overpressure. The arsine valve was closed and the valved HCl line was opened. An HCl flow rate of 250 sccm/sec provided an etch rate=1.6 Å/sec at this temperature.

While the GaAs layer of Region 260 was slightly roughened by the etch, it was still atomically flat with an RMS roughness of about 0.0968 nm. The GaAs surface previously covered with the oxide mask (region 227) had an RMS roughness of 1.4908 nm. While the source of the surface roughening is unclear, it may result from the oxide/GaAs interface at the time of oxidation and it may be due to a slight etch of the GaAs during the oxide removal process.

The in-situ etch process was also characterized as a function of temperature. According to various embodiments, both the etch rate and the surface of the GaAs first layer under the mask can be significantly improved if the in-situ etch is performed at higher temperatures. This trend is likely due to the increased molecular decomposition of HCl at T>550° C. The entire oxide mask (about 300 Å) can be completely removed in 10 seconds at 550° C. compared to the 500 seconds required at 300° C.

After the in-situ etch step, the chamber temperature was increased to 600° C. in preparation for the overgrowth process. The GaAs overgrowth to form the third layer (about 100 nm) used gas flows similar to the SAE step.

In various other embodiments, the in-situ mask removal process can be used in the growth of buried nanopatterned heterostructures, such as, for example, growth of a buried single $In_{0.20}Ga_{0.80}As$ (120 Å) quantum wells (QW). The QW can be grown under the conditions described above and emit RTPL at 1.075 μm. The in-situ etch process (at 300° C.) does not significantly affect the optical properties of the capped active region. The etch process at 300° C. can also be quite selective in that 30 nm of oxide can be removed from regions 227 without significantly affecting the 20 nm GaAs cap layer in region 226.

According to various embodiments, this exemplary processes can be used to fabricate any structure that requires selective epitaxial deposition on a substrate including, but not limited to, semiconductor lasers, semiconductor detectors, and structures involving patterned quantum dot deposition.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming a semiconductor device comprising:
    forming an $Al_xO_y$ layer on a first layer;
    patterning the $Al_xO_y$ layer by forming a first region and a second region, wherein a thickness of the second region is greater than a thickness of the first region;
    placing the patterned $Al_xO_y$ layer disposed on the first layer in a growth chamber;
    removing the first region of the $Al_xO_y$ layer to expose a first portion of the first layer;
    epitaxially growing a second layer on the exposed first portion of the first layer; and
    removing the second region of the $Al_xO_y$ layer to expose a second portion of the first layer within the growth chamber.

2. The method of claim 1 wherein the first layer comprises GaAs.

3. The method of claim 1, wherein the second layer comprises GaAs.

4. The method of claim 1, further comprising forming a third layer over the second layer and the exposed second portion of the first layer.

5. The method of claim 4, wherein the third layer comprises GaAs.

6. The method of claim 1, wherein the step of removing the first region of the $Al_xO_y$ layer to expose the first portion of the first layer comprises exposing the first region to a carrier gas comprising hydrogen at a temperature of about 900°.

7. The method of claim 1, wherein the step of forming an $Al_xO_y$ layer on the first layer comprises oxidizing an AlGaAs layer.

8. The method of claim 1, wherein the step of patterning the $Al_xO_y$ layer by forming a first region and a second region comprises:
    depositing a photoresist layer on the $Al_xO_y$ layer;
    patterning the photoresist layer; and
    forming the first region by etching the $Al_xO_y$ layer using a wet chemical etch comprising HCl.

9. The method of claim 1, wherein the step of removing the second region of the $Al_xO_y$ layer within the growth chamber comprises exposing the second region of the $Al_xO_y$ layer to HCl in a carrier gas comprising hydrogen.

10. The method of claim 1, wherein epitaxially growing a second layer comprises a growth rate of about 7 Å/sec or less.

11. The method of claim 1, wherein the step of removing the second region of the $Al_xO_y$ layer within the growth chamber is conducted at a temperature of 550° C. or higher.

12. The method of claim 1, wherein the step of removing the second region of the $Al_xO_y$ layer within the growth chamber comprises stabilizing a temperature in the growth chamber to about 300° C. and providing an $AsH_3$ overpressure.

13. The method of claim 2, wherein the GaAs layer is disposed on a substrate comprising GaAs (100).

14. A method for removing a mask in a selective area epitaxy process comprising:
- forming a first layer on a substrate;
- forming an $Al_xO_y$ layer on the first layer;
- patterning the $Al_xO_y$ layer by forming a first region and a second region, wherein a thickness of the second region is greater than a thickness of the first region;
- placing the patterned $Al_xO_y$ layer disposed on the first layer in a growth chamber;
- forming a mask by exposing the patterned $Al_xO_y$ layer to a hydrogen flow at about 900° C., wherein the hydrogen flow removes the first region of the $Al_xO_y$ layer to expose a first portion of the first layer;
- epitaxially growing a second layer on the exposed first portion of the first layer; and
- removing the mask to expose a second portion of the first layer by introducing into the growth chamber an etchant comprising HCl in a hydrogen carrier gas.

15. The method of claim 14, wherein the step of forming an $Al_xO_y$ layer on the first layer comprises oxidizing the first layer at a temperature of about 425° C. or more.

16. The method of claim 14, wherein the step of forming a mask by exposing the patterned $Al_xO_y$ layer to a hydrogen flow at about 900° C. comprises an exposure time of about 5 minutes or more.

17. The method of claim 14, wherein the step of epitaxially growing a second layer on the exposed first portion of the first layer comprises selective area epitaxy growth of GaAs at a rate of about 4 Å/sec.

18. A semiconductor device formed by a method comprising:
- forming an $Al_xO_y$ layer on a first layer;
- patterning the $Al_xO_y$ layer by forming a first region and a second region, wherein a thickness of the second region is greater than a thickness of the first region;
- placing the patterned $Al_xO_y$ layer disposed on the first layer in a growth chamber;
- forming a dielectric mask by removing the first region of the $Al_xO_y$ layer to expose a first portion of the first layer;
- epitaxially growing a second layer on the exposed first portion of the first layer; and
- removing the second region of the $Al_xO_y$ layer to expose a second portion of the first layer using an in-situ etch.

19. The method of claim 18, wherein the first layer comprises (001) oriented GaAs.

20. The method of claim 18, wherein the second layer comprises GaAs.

* * * * *